United States Patent
Aigo et al.

(10) Patent No.: US 9,691,607 B2
(45) Date of Patent: Jun. 27, 2017

(54) PROCESS FOR PRODUCING EPITAXIAL SILICON CARBIDE SINGLE CRYSTAL SUBSTRATE AND EPITAXIAL SILICON CARBIDE SINGLE CRYSTAL SUBSTRATE OBTAINED BY THE SAME

(75) Inventors: Takashi Aigo, Tokyo (JP); Hiroshi Tsuge, Tokyo (JP); Taizo Hoshino, Tokyo (JP); Tatsuo Fujimoto, Tokyo (JP); Masakazu Katsuno, Tokyo (JP); Masashi Nakabayashi, Tokyo (JP); Hirokatsu Yashiro, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 1180 days.

(21) Appl. No.: 13/639,309

(22) PCT Filed: Apr. 7, 2011

(86) PCT No.: PCT/JP2011/059221
§ 371 (c)(1),
(2), (4) Date: Oct. 4, 2012

(87) PCT Pub. No.: WO2011/126145
PCT Pub. Date: Oct. 13, 2011

(65) Prior Publication Data
US 2013/0029158 A1    Jan. 31, 2013

(30) Foreign Application Priority Data
Apr. 7, 2010   (JP) ................................. 2010-088911

(51) Int. Cl.
*H01L 21/02* (2006.01)
*C30B 25/10* (2006.01)
*C30B 29/36* (2006.01)

(52) U.S. Cl.
CPC ........ *H01L 21/02378* (2013.01); *C30B 25/10* (2013.01); *C30B 29/36* (2013.01);
(Continued)

(58) Field of Classification Search
CPC combination set(s) only.
See application file for complete search history.

(56) References Cited

U.S. PATENT DOCUMENTS

| 2005/0064723 A1* | 3/2005 | Sumakeris ........ H01L 21/30608 438/757 |
| 2009/0114148 A1* | 5/2009 | Stahlbush ............... C30B 25/02 117/89 |

(Continued)

FOREIGN PATENT DOCUMENTS

| CN | 101336314 A | 12/2008 |
| DE | 10 2008 060 372 A1 | 3/2010 |

(Continued)

OTHER PUBLICATIONS

Chen et al., "Growth and characterization of 4H-SiC epilayers on substrates with different off-cut angles", Journal of Applied Physics, vol. 98, pp. 114907-1-114907-6, 2005.

(Continued)

*Primary Examiner* — Duy Deo
*Assistant Examiner* — Erin Bergner
(74) *Attorney, Agent, or Firm* — Birch, Stewart, Kolasch & Birch, LLP

(57) ABSTRACT

Disclosed is a process for producing an epitaxial single-crystal silicon carbide substrate by epitaxially growing a silicon carbide film on a single-crystal silicon carbide substrate by chemical vapor deposition. The step of crystal growth in the process comprises a main crystal growth step, which mainly occupies the period of epitaxial growth, and a secondary crystal growth step, in which the growth tem- (Continued)

perature is switched between a set growth temperature ($T_0$) and a set growth temperature ($T_2$) which are respectively lower and higher than a growth temperature ($T_1$) used in the main crystal growth step. The basal plane dislocations of the single-crystal silicon carbide substrate are inhibited from being transferred to the epitaxial film. Thus, a high-quality epitaxial film is formed.

2 Claims, 4 Drawing Sheets

(52) U.S. Cl.
CPC .... *H01L 21/0262* (2013.01); *H01L 21/02433* (2013.01); *H01L 21/02529* (2013.01); *H01L 21/02661* (2013.01)

(56) References Cited

U.S. PATENT DOCUMENTS

2009/0278136 A1 11/2009 Beaumont et al.
2009/0302328 A1 12/2009 Ohno et al.

FOREIGN PATENT DOCUMENTS

| EP | 1 739 727 A2 | 1/2007 |
|---|---|---|
| EP | 1 739 727 A3 | 6/2011 |
| JP | 9-52796 A | 2/1997 |
| JP | 2003-212694 A | 7/2003 |
| JP | 2008-115035 A | 5/2008 |
| JP | 2009-256138 A | 11/2009 |
| JP | 2009-295728 A | 12/2009 |

OTHER PUBLICATIONS

International Search Report, dated Jul. 19, 2011, issued in PCT/JP2011/059221.

Tsuchida et al., "Growth of Thick 4H-SiC(0001) Epilayers and Reduction of Basal Plane Dislocations", Japanese Journal of Applied Physics, vol. 44, No. 25, pp. L 806-L 808, 2005.

Extended European Search Report, issued Feb. 25, 2015, for European Application No. 11766043.1.

Powell et al., "SiC Materials-Progress, Status, and Potential Roadblocks," Proceedings of the IEEE, vol. 90, No. 6, Jun. 2002, pp. 942-955.

* cited by examiner

PROCESS FOR PRODUCING EPITAXIAL SILICON CARBIDE SINGLE CRYSTAL SUBSTRATE AND EPITAXIAL SILICON CARBIDE SINGLE CRYSTAL SUBSTRATE OBTAINED BY THE SAME

TECHNICAL FIELD

The present invention relates to a process for producing an epitaxial silicon carbide single crystal substrate wherein a silicon carbide film is formed through epitaxial growth on a silicon carbide single crystal substrate by using a chemical vapor deposition process, and an epitaxial silicon carbide single crystal substrate which has been obtained by the process.

BACKGROUND ART

Silicon carbide (SiC) is excellent in heat resistance and mechanical strength and physically and chemically stable. Therefore, silicon carbide is attracting attention as an environment-resistant semiconductor material. Also, in recent years, there have been increased demands for an SiC single crystal substrate, as a substrate for a high-frequency high-voltage resistant electronic device, etc.

In a case where electric power devices, high-frequency device, etc., are to be manufactured by using an SiC single crystal substrate, it may be usually performed in general to epitaxially grow an SiC thin film on a substrate by using a process called a chemical vapor deposition process (CVD process), or to directly implant thereinto a dopant by using an ion implantation process. In the latter case, annealing at a high temperature may be required after the implantation, and for this reason, the formation of a thin film using an epitaxial growth may be employed frequently.

Heretofore, a hollow defect called a micropipe may be present in an SiC single crystal substrate, and this defect may be carried over into the epitaxial film to be formed on the substrate, so as to deteriorate the characteristics and reliability of the resultant device. However, in recent years, along with the progress in techniques for producing an SiC single crystal substrate, the density micropipes may be decreased to almost zero, and therefore, the effect of other defects on the device are being studied. Among these, it is known that a basal plane dislocation is usually split into two partial dislocations in the SiC crystal, and a stacking fault is generated therebetween (please refer to Non-Patent Document 1). When this defect is present the inside of a device, the defect may adversely affect the reliability of a bipolar device, a Schottky barrier diode, etc. (please refer to Non-Patent Document 2). Accordingly, there are being made attempts to reduce the defect.

FIG. 1 schematically shows the behavior of a basal plane dislocation to be contained in an SiC single crystal substrate, when epitaxial growth is performed on the surface of an SiC single crystal substrate. As a result of the epitaxial growth, about 95% or more of the basal plane dislocations in the substrate may be converted into an edge dislocation. The reason for this is that, as shown in FIG. 1(a), the dislocation energy may be smaller and more stable, when the basal plane dislocation 1 in the substrate may be converted into an edge dislocation 3 so that the dislocation length becomes short, as compared with that in a case where the dislocation is carried over as such into the epitaxial film, so as to cause a basal plane dislocation 2.

FIG. 1(b) shows a case where the off-angle of the substrate is larger, and FIG. 1(c) shows a case where the off-angle of the substrate is smaller. When attention is paid to the relationship between the length of the edge dislocation 3, and the length of the basal plane dislocation 2 to be carried over into the epitaxial film, the reduction rate at which the dislocation length becomes shorter after the conversion into an edge dislocation 3 as shown in FIG. 1(c) may be higher, and a more stable condition is achieved in view of the energy. Accordingly, as the off-angle of the substrate is smaller, the rate of the conversion into an edge dislocation is higher. Further, along with the reduction in the off-angle of the substrate, the density of the basal plane dislocation itself appearing on the substrate surface may be decreased, and therefore, the basal plane dislocation to formed in the epitaxial film may be also decreased.

For this reason, from the standpoint of decreasing the basal plane dislocation in the epitaxial film, and of increasing the yield of the substrate from an SiC ingot, a substrate having an off-angle of 4° or less, which is smaller than the conventional off-angle of 8° may mainly be used at present. For example, in a case where a 4°-off substrate is used, the density of the dislocations which are not converted into edge dislocations but are carried over as basal plane dislocations into the epitaxial film, may be approximately from 100 to 200 dislocations/cm$^2$. However, if the area of the device becomes larger, even with the basal plane dislocations to such an extent, the probability that stacking faults which have been caused by the dislocations are present inside the device may be increased, and this may give rise to a deterioration in the device characteristics or yield.

On the other hand, when the off-angle of the substrate becomes smaller, the number of steps which are present on the substrate may be decreased, and therefore, so-called step-flow growth can hardly occur at the time of the epitaxial growth. As a result, another defect such as triangular defect may be increased, to thereby pose a problem such as deterioration in the device characteristics, or reduction in the yield. Accordingly, in order to reduce the basal plane dislocations which are carried over into the epitaxial film from the substrate, the use of a substrate having a small off-angle may be attempted. However, the current techniques may be limited to the use of an about 4°-off substrate.

In this circumstances, various processes have heretofore been studied so as to reduce the basal plane dislocations which are carried over into the epitaxial film from the substrate. For example, there have been reported the following processes:

a process where an epitaxial film is grown on an SiC single crystal substrate having a smooth surface, while controlling the relationship between the surface roughness of the epitaxial film to be grown, and the growth rate of the epitaxial film based on a predetermined conditional equation (please refer to Patent document 1);

a process where two kinds of buffer layers having different donor concentrations are previously grown on an SiC single crystal substrate, and an epitaxial film is grown through the buffer layers (please refer to Patent Document 2);

a process where the supply of the raw material gas is stopped for 5 to 30 minutes in the middle of the crystal growth step of growing an epitaxial film and the basal plane dislocation is converted into an edge location in the subsequent growth stage (please refer to Patent Document 3);

a process where a plurality of inhibiting layers having different nitrogen concentrations so as to suppress the basal plane dislocation density are provided on an SiC single crystal substrate, and an active layer composed of an SiC single crystal thin film is formed thereon (please refer to Patent Document 4); and a process where a predetermined unevenness is formed on the surface of an SiC single crystal substrate to provide a physical wall in advance of the growth of an epitaxial film, and a basal plane dislocation is converted into an edge dislocation by collision against the wall during the growth of the epitaxial film (please refer to Patent Document 5).

In this connection, Patent Document 6 discloses that the substrate temperature is decreased by 50 to 100° C. on the way. However, this operation is performed when the introduction of the material gas is stopped in the middle of the crystal growth step so as to once interrupt the epitaxial growth.

PRIOR ART DOCUMENTS

Patent Documents

[Patent Document 1] JP-A (Japanese Unexamined Patent Publication) No. 2008-4888
[Patent Document 2] JP-A No. 2009-295728
[Patent Document 3] JP-A No. 2008-115034
[Patent Document 4] JP-A No. 2008-74661
[Patent Document 5] JP-A No. 2008-311541
[Patent Document 6] JP-A No. 8-115878

Non-Patent Documents

[Non-Patent Document 1] X. J. Ning et al.: Journal of American Ceramics Soc., Vol. 80 (1997), page 1645
[Non-Patent Document 2] H. Fujiwara et al.: Applied Physics Letters, Vol. 87 (2005), 051912

SUMMARY OF THE INVENTION

Problems to be Solved by the Invention

As described above, in a case where a silicon carbide film is epitaxially grown on a silicon carbide single crystal substrate by using a CVD process, it is an important problem to prevent a basal plane dislocation from being carried over into the resultant epitaxial film, while involving an appropriate step-flow growth. However, as understood from the facts that many studies have been heretofore made, this problem has not yet sufficiently been overcome. For example, even in the case of a 4°-off substrate which is becoming a mainstream substrate at present, a stacking fault, which is capable of being generated due to a basal plane dislocation remaining in the epitaxial film, makes it difficult to avoid the deterioration in device characteristics or the reduction in the yield.

In view of this problem, an object of the present invention is to provide a process for producing an epitaxial silicon carbide single crystal substrate, wherein a high-quality epitaxial film can be formed by preventing a basal plane dislocation to be contained in a silicon carbide single crystal substrate, from being carried over into a silicon carbide film which is formed by the epitaxial growth.

Another object of the present invention is to provide an epitaxial silicon carbide single crystal substrate having a silicon carbide film wherein the basal plane dislocation is reduced.

Means for Solving the Problem

As a result of earnest study on measures for effectively reducing the basal plane dislocation which can be carried over into a silicon carbide to be epitaxially grown, the present inventors have found that the above problem can be solved by applying a thermal stress so as to cause a change in the migration state of atoms attached to the substrate surface during the epitaxial growth, and thereafter, epitaxially growing a silicon carbide film. The present invention has been accomplished based on this discovery.

That is, the process for producing an epitaxial silicon carbide single crystal substrate according to the present invention is a process for producing an epitaxial silicon carbide single crystal substrate, comprising forming a silicon carbide film through epitaxial growth on a silicon carbide single crystal substrate by a chemical vapor deposition process; wherein the crystal growth step of epitaxially growing the silicon carbide film on the substrate includes a crystal growth sub-step involving a temperature switching operation of changing the growth temperature up or down between a lower preset temperature $T_0$ and a higher preset temperature $T_2$ with respect to a growth temperature $T_1$ in a crystal growth main step occupying the majority of the epitaxial growth time.

The present invention also provides an epitaxial silicon carbide single crystal substrate, which is an epitaxial silicon carbide single crystal substrate which has been obtained by the above process, wherein the basal plane dislocation density of the silicon carbide film is 20 dislocations/cm$^2$ or less.

The present invention having the above constitution may include, e.g., the following embodiments.

[1] A process for producing an epitaxial silicon carbide single crystal substrate, comprising forming a silicon carbide film through epitaxial growth on a silicon carbide single crystal substrate by a chemical vapor deposition process, wherein the crystal growth step of epitaxially growing the silicon carbide film on the substrate includes a crystal growth sub-step involving a temperature switching operation of changing the growth temperature up or down between a lower preset temperature $T_0$ and a higher preset temperature $T_2$ with respect to a growth temperature $T_1$ in a crystal growth main step occupying the majority of the epitaxial growth time.

[2] The process for producing an epitaxial silicon carbide single crystal substrate according to [1], wherein the crystal growth sub-step is included in the first half side of the crystal growth step.

[3] The process for producing an epitaxial silicon carbide single crystal substrate according to [1] or [2], wherein the crystal growth sub-step is included in the crystal growth initial stage, which is located immediately after the start of the epitaxial growth.

[4] The process for producing an epitaxial silicon carbide single crystal substrate according to [1] or [2], wherein the temperature switching operation includes one or more $T_0$-$T_2$ switching actions of switching the preset temperature from $T_0$ to $T_2$, and also includes one or more $T_2$-$T_0$ switching actions of switching the preset temperature from $T_2$ to $T_0$.

[5] The process for producing an epitaxial silicon carbide single crystal substrate according to [1] or [2], wherein the temperature switching operation is performed within a temperature range of 1,500 or more and 1,700° C. or less.

[6] The process for producing an epitaxial silicon carbide single crystal substrate according to [1] or [2], wherein the film thickness of the silicon carbide film grown in the crystal growth sub-step is 0.2 μm or more and 1.0 μm or less.

[7] The process for producing an epitaxial silicon carbide single crystal substrate according to [1] or [2], wherein the length of the crystal growth sub-step is from 5 to 10 minutes.

[8] The process for producing an epitaxial silicon carbide single crystal substrate according to [1] or [2], wherein the off-angle of the silicon carbide single crystal substrate is 2° or more and 6° or less.

[9] The process for producing an epitaxial silicon carbide single crystal substrate according to [1] or [2], wherein in the crystal growth main step, the silicon carbide film is grown by alternately repeating the growth performed by setting the pressure to $2\times10^4$ Pa or more and $3\times10^4$ Pa or less, and the growth performed by setting the pressure to more than 0 Pa and $1\times10^4$ Pa or less.

[10] The process for producing an epitaxial silicon carbide single crystal substrate according to [1] or [2], wherein in the crystal growth main step, the silicon carbide film is grown by alternately repeating the growth performed by setting the atomic number ratio (C/Si) of carbon and silicon contained in the raw material gas 1.0 or more and 1.5 or less, and the growth performed by setting the atomic number ratio to 0.5 or more and less than 1.0.

[11] An epitaxial silicon carbide single crystal substrate, which is an epitaxial silicon carbide single crystal substrate which has been obtained by the process according to [1] or [2], wherein the basal plane dislocation density of the silicon carbide film is 20 dislocations/cm$^2$ or less.

Effect of the Invention

According to the present invention having the above-described constitution, the basal plane dislocation to be carried over into the silicon carbon oxide to be epitaxially grown, from a silicon carbide single crystal substrate can effectively be decreased. Therefore, the present invention can provide an epitaxial silicon carbide single crystal substrate having a high-quality silicon carbide film. In addition, the present invention also provides an effect wherein the thus obtained epitaxial silicon carbide single crystal substrate can be applied to various electronic devices and moreover, the device characteristics, yield, etc., can be enhanced.

MODE FOR CARRYING OUT THE INVENTION

<Conventional Process>

Figure 5:
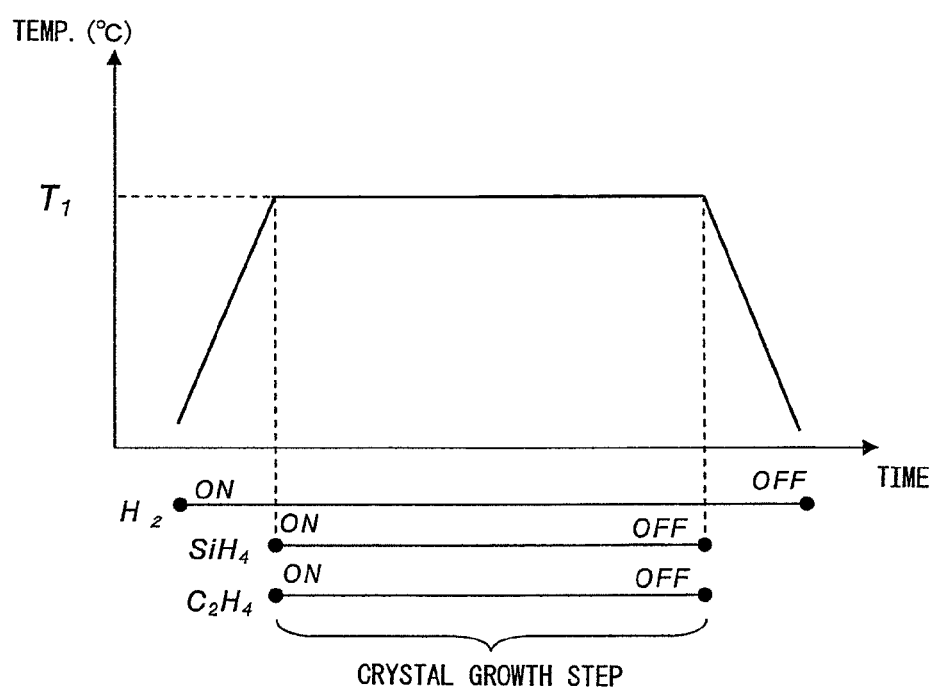
FIG. 5 illustrates an example of the growth sequence to be used in the conventional process.

At first, a typical growth sequence to be used in the epitaxial growth of a silicon carbide film by a conventional process is shown in FIG. 5, together with the gas introduction timing to be used therefor.

In such a growth sequence, a silicon carbide single crystal substrate may be placed in a growth furnace, the inside of the growth furnace is evacuated, and then the pressure may be adjusted to be approximately from $1\times10^4$ to $3\times10^4$ Pa, e.g., by introducing a hydrogen gas.

Subsequently, the temperature of the growth furnace may be raised while keeping the pressure constant, and when the growth temperature reaches $T_1$ of 1,550 to 1,650° C., material gases (raw material gases) $SiH_4$ and $C_2H_4$ may be introduced so as to start the epitaxial growth. In general, the flow rate of $SiH_4$ may be from 40 to 50 cm$^3$/min, and the flow rate of $C_2H_4$ may be from 30 to 40 cm$^3$/min. The growth rate of the silicon carbide film may be adjusted to 6 to 7 μm/hr.

The film thickness of a epitaxial film generally utilized for a device, etc., may be about 10 μm, and the above growth rate may be determined by taking into account the productivity based on this film thickness. After the epitaxial growth for a predetermined time, the introduction of $SiH_4$ and $C_2H_4$ may be stopped when a predetermined film thickness is obtained, and the temperature of the growth furnace may be decreased, while only flowing a hydrogen gas.

After the temperature is decreased to normal (or room) temperature, the introduction of the hydrogen gas may be stopped, and the inside of the growth furnace may be evacuated. Further, the growth furnace may be returned to the atmospheric pressure by introducing thereinto an inert gas, and the substrate which has been subjected to the epitaxial growth may be taken out.

In the above-described conventional process, a silicon carbide film may be epitaxially grown through the crystal growth as step shown in FIG. 5. According to such a conventional process, there may be a tendency that when the basal plane dislocation to be contained in the silicon carbide single crystal substrate (hereinafter, sometimes simply referred to as "SiC substrate") is once carried over into the epitaxially grown silicon carbide film (sometimes simply referred to as "epitaxial film"), this dislocation is carried over until the completion of the growth and the basal plane dislocation finally appears on the surface of the resultant epitaxial film.

<Process According to the Present Invention>

On the other hand, the process according to the present invention may be characterized in that a temperature switching operation of switching the growth temperature up or down in the middle of the crystal growth step of epitaxially growing a silicon carbide film is performed on a silicon carbide single crystal substrate.

In the process according to the present invention having such a constitution, a temperature switching operation of changing the growth temperature up or down may be performed in the middle of the crystal growth step, while continuing the crystal growth, and a thermal stress is applied thereto so as to cause an effect on the migration state of atoms (Si atoms, C atoms) attached to the SiC substrate, so that the basal plane dislocation which has been carried over from the SiC substrate can be converted into an edge dislocation, whereby the basal plane dislocation to be carried over into the epitaxial film can be reduced.

In this connection, as shown in FIG. 9 of Patent Document 1, it is known that a difference is provided between the temperature of the etching step of etching the substrate with a hydrogen gas, etc., prior to the crystal growth step of epitaxially growing a silicon carbide film, and the growth temperature in the crystal growth step. The process according to the present invention is different from the technique of Patent Document 1 in that the temperature is changed during growth. In addition, in Patent Document 6, the substrate temperature is decreased by 50 to 100° C. when the introduction of a material gas is stopped in the middle of the crystal growth step to once interrupt the epitaxial growth. However, this technique does not apply a thermal stress, and therefore the present invention is different from such a technique.

In the present invention, the temperature switching operation may be performed by switching the temperature up or down between a preset temperature $T_0$ which is lower than the growth temperature $T_1$ in a crystal growth main step occupying the majority of the epitaxial growth time of the crystal growth step, and a preset temperature $T_2$ which is higher than the growth temperature $T_1$. Among these temperatures, with respect to the growth temperature $T_1$, for example, in the thermo-chemical deposition process (thermal CVD process), a silicon carbide film may be epitaxially grown at a growth temperature of 1,550 to 1,650° C., in general. On the other hand, in a case where the process according to the present invention is performed by the thermal CVD process, the crystal growth temperature $T_1$ may preferably be set in the range of 1,550 to 1,650° C., more preferably in the range of 1,580 to 1,620° C.

In general, the thermal CVD process may be employed for the epitaxial growth of a silicon carbide film. For example, the horizontal CVD apparatus may have a relatively simple structure of the apparatus and further, the process may be excellent in reproducibility, because the growth of the film can be adjusted by on-off control of a raw material gas, etc. In the process according to the present invention, the thermal CVD process may preferably be employed. Hereinbelow, the present invention will be described, for example, by referring to an embodiment using the thermal CVD process, but the present invention may be applicable also to other processes such as plasma CVD.zx The temperature switching operation may preferably be performed in the range of 1,500 or more and 1,700° C. or less. More specifically, if the preset temperature $T_0$ on the lower temperature side is less than 1,500° C., for example, the
crystallinity of the silicon carbide film on the SiC substrate may be deteriorated or the growth rate may be reduced so that the quality of the epitaxial film to be formed on the SiC substrate may be impaired. On the other hand, if the preset temperature $T_2$ on the higher temperature side exceeds 1,700° C., for example, atoms attached to the SiC substrate surface may be re-evaporated and accordingly, the quality of the thus obtained epitaxial film may be impaired. Even in view of the application of a thermal stress to atoms attached to the SiC substrate surface, the temperature switching operation may preferably be performed in the range as stated above, in order to keep almost constant the growth rate of the epitaxial film in the crystal growth step. The preset temperature $T_0$ may preferably be 1,500 or more and 1,550° C. or less, more preferably, 1,500 or more and 1,520° C. or less. The preset temperature $T_2$ may preferably be 1,650 or more and 1,700° C. or less, more preferably 1,680 or more and 1,700° C. or less.

Figure 1:
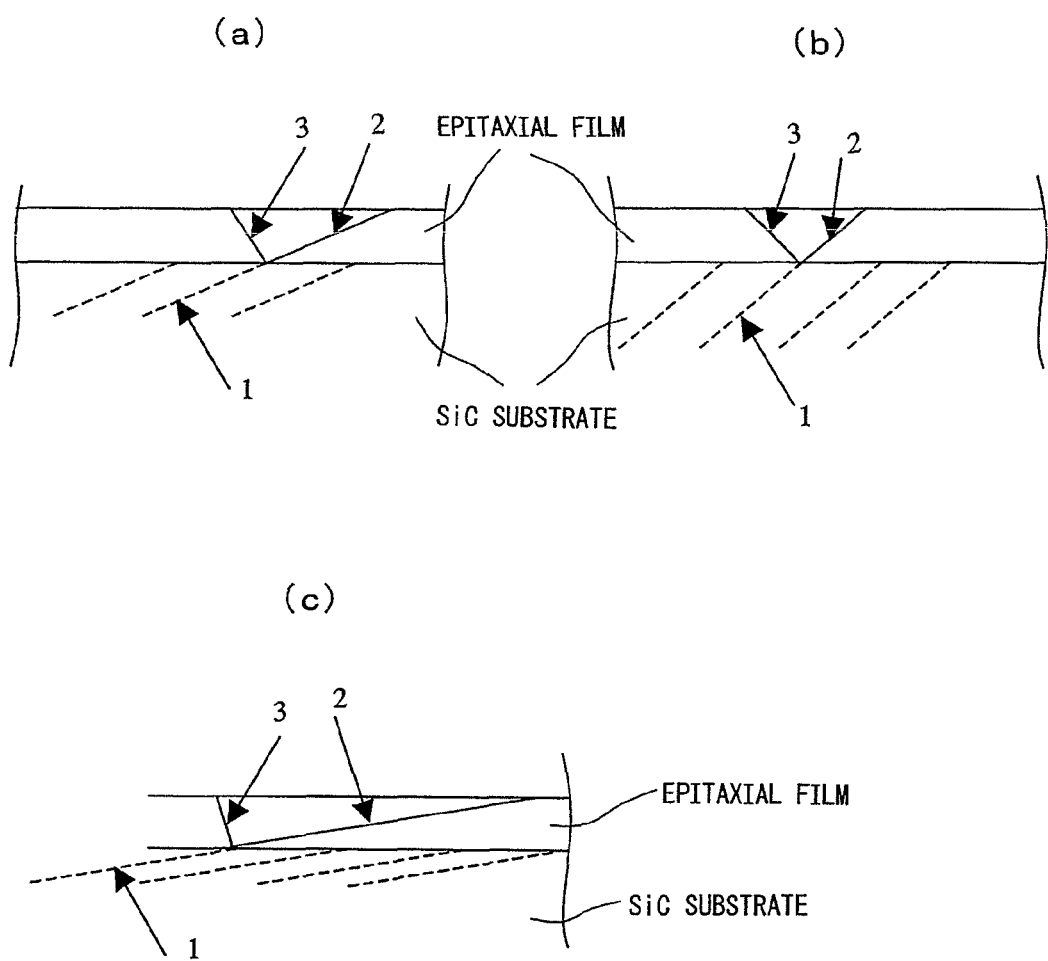
FIG. 1(a) is a schematic view showing how the basal plane dislocation contained in a silicon carbide single crystal substrate is carried over into an epitaxial film.
FIG. 1(b) illustrates the behavior when the off angle of the substrate is large.
FIG. 1(c) illustrates the behavior when the off-angle is small.
Figure 2:
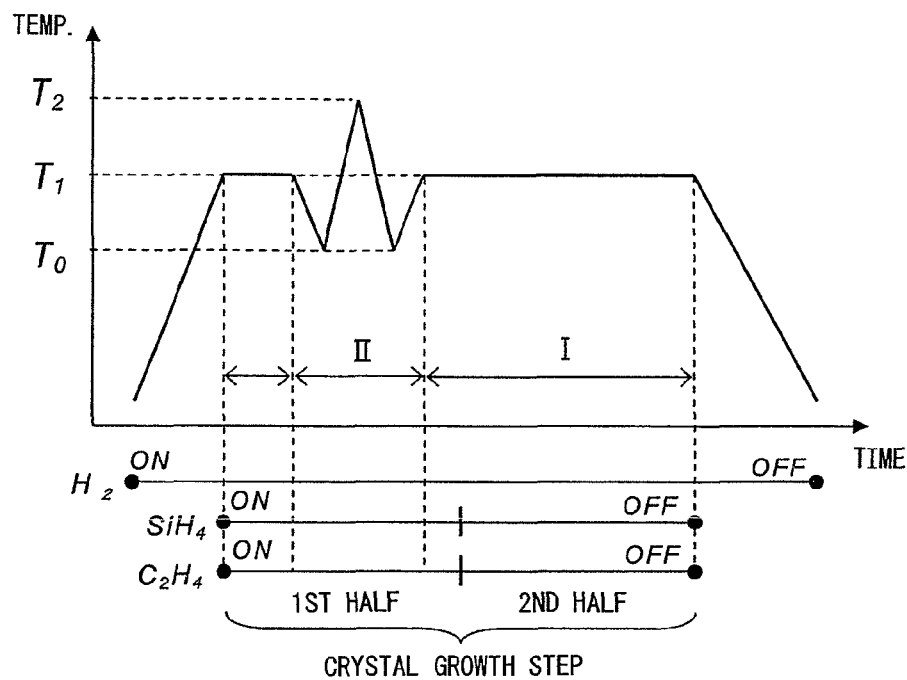
FIG. 2 illustrates an example of the growth sequence to be used in the process for producing the present invention.

The temperature switching operation will be described by using an example of the growth sequence as shown in FIG. 2.

First, an SiC substrate may be set in a growth furnace and the inside of the growth furnace may be evacuated, and then the pressure thereof may be adjusted to be from $1\times10^4$ to $3\times10^4$ Pa by introducing thereinto, for example, a hydrogen gas. Thereafter, the temperature in the growth furnace may be raised, while keeping the pressure constant. When the temperature reaches the growth temperature $T_1$, a raw material gases for providing a silicon source and a carbon source (FIG. 2 shows an example using $SiH_4$ gas and $C_2H_4$ gas) may be introduced to start the growth.

A silicon carbide film is epitaxially grown by flowing the raw material gases while keeping the growth temperature $T_1$ for a period of time, and thereafter, the process may be designed so that it includes a crystal growth sub-step (II) involving a temperature switching operation of, with the raw material gases still flowing, decreasing the temperature in the growth furnace to the preset temperature $T_0$ which is a temperature lower than the growth temperature $T_1$, then raising the temperature in the growth furnace to the preset temperature $T_2$ which is a temperature higher than the growth temperature $T_1$, and further, decreasing the temperature from the preset temperature $T_2$ to the preset temperature $T_0$, and thereafter, returning the temperature in the growth furnace to the growth temperature $T_1$.

With respect to the temperatures $T_0$, $T_1$ and $T_2$, $(T_1-T_0)$ may preferably be in the range of 50 to 100° C., and $(T_2-T_1)$ may be also preferably in the range of 50 to 100° C. These temperatures may be measured by using a radiation thermometer and, for example, the temperatures can be determined by measuring the heated graphite portion.

Thereafter, the temperature may be maintained at the growth temperature $T_1$, and the epitaxial growth of a silicon carbide film may be performed by a crystal growth main step (I) occupying a longer duration of time than that of the crystal growth sub-step (II). When a crystal carbide film having a desired thickness is epitaxially grown, and then the introduction of the raw material gases may be stopped, that is, the crystal growth step may be terminated, and the temperature may be decreased, for example, while flowing only a hydrogen gas.

The temperature switching operation in the present invention applies a thermal stress so as to produce a change in the migration of atoms attached to the SiC substrate by the epitaxial growth, and therefore, in the silicon carbide film which has been grown during this operation, the nitrogen doping density may be changed on the order of a factor of several to several times that value at the growth temperature $T_1$. Therefore, so as not to affect the device behavior when the resultant product is applied to a device, the crystal growth sub-step involving a temperature switching operation may preferably be included in the first half side of the crystal growth step. The crystal growth sub-step may more preferably be included in the crystal growth initial stage immediately after the start of epitaxial growth, so that the silicon carbide film which has been grown in the crystal growth sub-step involving a temperature switching operation can be located as close to the SiC substrate as possible.

In this connection, in a case where it is sufficient that the basal plane location is reduced to a certain extent, depending on the intended use of the resultant product, the crystal growth sub-step may be included in the second half side of the crystal growth step.

As in the example as shown in FIG. 2, the temperature switching operation may preferably include at least one "$T_0$-$T_2$ switching action" of switching the preset temperature from $T_0$ to $T_2$, and also include at least one "$T_2$-$T_0$ switching action" of switching the preset temperature from $T_2$ to $T_0$. The temperature switching operation may more preferably include two or more $T_0$-$T_2$ switching actions, and also include two or more $T_2$-$T_0$ switching actions.

In the temperature switching operation, each of the preset temperature $T_0$ and the preset temperature $T_2$ may be held at the temperature for a predetermined time. However, in order not to impair the quality of the epitaxial film, it may be preferred to switch the temperature by taking as short a holding time as possible.

The time to be required for switching between the preset temperatures $T_0$ and $T_2$ may be changed depending on the capacity of the heating means of the growth furnace to be used therefor. In both of the cases of temperature rise and temperature decrease, the switching may be performed at a rate of approximately from 100 to 150° C./min, whereby the effect of the present invention can be obtained without impairing the quality of the epitaxial film.

In the example of FIG. 2, the crystal temperature is decreased to the preset temperature $T_0$ at the start of the temperature switching operation, but the temperature switching operation may be of course an operation of raising the growth temperature to the preset temperature $T_2$ at the start.

The kind of the raw material gas which can be used in the present invention may be not particularly limited. Specific example thereof may include: a gas such as disilane, dichlorosilane and trichlorosilane as the silicon source gas; and a gas such as propane, methane, ethane and acetylene as the carbon source gas, in addition to monosilane and ethylene. Further, the kind of the carrier gas, etc., may be not particularly limited.

In the process according to the present invention, the length of the crystal growth sub-step may be sufficient, if it is a duration of time which can convert the direction of the basal plane dislocation which has been carried over from the SiC substrate. The length of the crystal growth sub-step may preferably be from 5 to 10 minutes, more preferably from 8 to 10 minutes. When the length of the crystal growth sub-step is 5 minutes or more, the direction of the dislocation can surely be converted. On the other hand, if the length exceeds 10 minutes, as described above, the difference between the doping density of the silicon carbide film which has been grown in the crystal growth sub-step, and the doping density of the silicon carbide film which has been grown in the crystal growth main step may become too large, so that this difference can affect a device when the resultant product is applied to the device. The "crystal growth main step" as used in the present invention refers to the above-described "step occupying a longer duration of time than that of the crystal growth sub-step" in the crystal growth step.

The silicon carbide film grown in the crystal growth sub-step may be sufficient, if it has a film thickness which can convert the direction of the basal plane dislocation. The film thickness may preferably be 0.2 or more and 1.0 μm or less, more preferably 0.5 or more and 1.0 μm or less. When the film thickness is 0.2 μm or more, the basal plane dislocation which has been carried over from the SiC substrate can be effectively converted into an edge dislocation. On the other hand, if the film thickness exceeds 1.0 μm, the portion having a large difference in the doping density from that of the silicon carbide film grown in the crystal growth main step may be increased in a similar manner as described hereinabove, and the quality of the epitaxial film can be impaired.

In the process for producing an epitaxial silicon carbide single crystal substrate according to the present invention, with respect to the deposition conditions except for the growth temperature, such as pressure condition and raw material gas concentration, the conditions employed in a conventional process may be applied thereto (with respect to such conditions, for example, a document: A. Veneroni et al., *Crystal Research Technique* 40, No. 10-11, 972-975 (2005), may be referred to). In addition, with respect to the silicon carbide single crystal substrate to be used, in consideration of actual circumstances of the device fabrication at present, or of the development of step-flow growth, a silicon carbide single crystal substrate having an off-angle of 2 or more and 6° or less may preferably be used.

The film thickness of the silicon carbide film to be formed by the process according to the present invention may not be particularly limited. In consideration of the voltage resistance to be required for device characteristics, the productivity and the like, the film thickness may preferably be 5 μm or more and 50 μm or less. According to the present invention, the basal plane dislocation to be carried over from the SiC substrate can effectively be converted so as to decrease the basal plane dislocation to be contained in the silicon carbide film, so that an epitaxial silicon carbide single crystal substrate where the basal plane dislocation density in the thus formed silicon carbide film may be 20 dislocations/cm$^2$ or less, preferably 10 dislocations/cm$^2$ or less, can be obtained.

Therefore, the epitaxial silicon carbide single crystal substrate which has been obtained by the present invention can be applied to the fabrication of various electronic devices. Among these, from the standpoint of utilizing the low loss due to the use of SiC, the epitaxial silicon carbide single crystal substrate may preferably be applied to the fabrication of a power device to be used for electric power control, such as Schottky barrier diode, PIN diode, MOS diode and MOS transistor.

In this connection, according to other knowledge and discovery by the present inventors, it has been confirmed that, when the advancement of an atomic step is promoted under an epitaxial growth condition for providing the deposition of silicon carbide during the step-flow growth and in the middle of the deposition stage, either one or both of the pressure condition and the raw material gas concentration condition are intentionally changed to the outside of the condition for providing the deposition of silicon carbide so as to achieving the condition for providing the decomposition and re-evaporation of silicon carbide, whereby a two-dimensional nucleus which has been formed on the terrace can be decomposed.

Therefore, in the crystal growth main step according to the present invention, it is preferred to alternately repeat the epitaxial growth of a silicon carbide film to be performed under the high pressure condition set in the range of 2.0×10$^4$ Pa or more and to 3.0×10$^4$ Pa or less, and the epitaxial growth of a silicon carbide film to be performed under the low pressure condition set in the range of more than 0 Pa and 1.0×10$^4$ Pa or less. Due to the repetition of these pressure conditions, the advancement of an atomic step caused by the uptake of silicon carbide may be promoted under the high pressure condition, and the decomposition and re-evaporation of a two-dimensional nucleus may be promoted under the low pressure condition. As a result, a high-quality silicon carbide film can be epitaxially grown, while removing a two-dimensional nucleus capable of causing the mixing of a heterogeneous poly-type or step bunching.

From a similar standpoint, in the crystal growth main step, it is preferred to alternately repeat the epitaxial growth of a silicon carbide film to be performed under the high C/Si condition which is set such that the atomic number ratio (C/Si) of carbon and silicon contained in the raw material gas becomes 1.0 or more and 1.5 or less, and the epitaxial growth of a silicon carbide film to be performed under the low C/Si condition which is set such that the atomic number ratio (C/Si) becomes 0.5 or more and less than 1.0.

In this way, a silicon carbide film may be grown by repeating the changes of the pressure condition or raw material gas concentration condition in the crystal growth main step, whereby the problem of two-dimensional nuclei inhibiting the step-flow growth can be eliminated. Further, in the present invention, the epitaxial growth may be performed by decreasing the basal plane dislocation in the crystal growth sub-step, while decomposing a two-dimensional nucleus in the crystal growth main step, so that, even on a SiC substrate, for example, having an off-angle of less than 2°, a very high-quality silicon carbide film can be formed.

The present invention will more specifically be described hereinbelow based on Examples and the like, but the present invention is not limited to the contents of the following Examples.

EXAMPLES

Example 1

A silicon carbide single crystal ingot for a 3-inch (76 mm) wafer was sliced so as to provide a wafer having a thickness of about 400 μm, and then was subjected to roughening and normal polishing with a diamond abrasive grain to thereby prepare a silicon carbide single crystal substrate containing a 4H poly-type and having an off-angle of 4° in the [11-20] direction with respect to <0001> c-axis. This silicon carbide single crystal substrate was n-type, where the resistivity was about 0.02 Ω·cm. On the Si surface of the silicon carbide single crystal substrate (SiC substrate), a silicon carbide film was epitaxially grown in the following manner by using a thermal CVD process.

Figure 3:
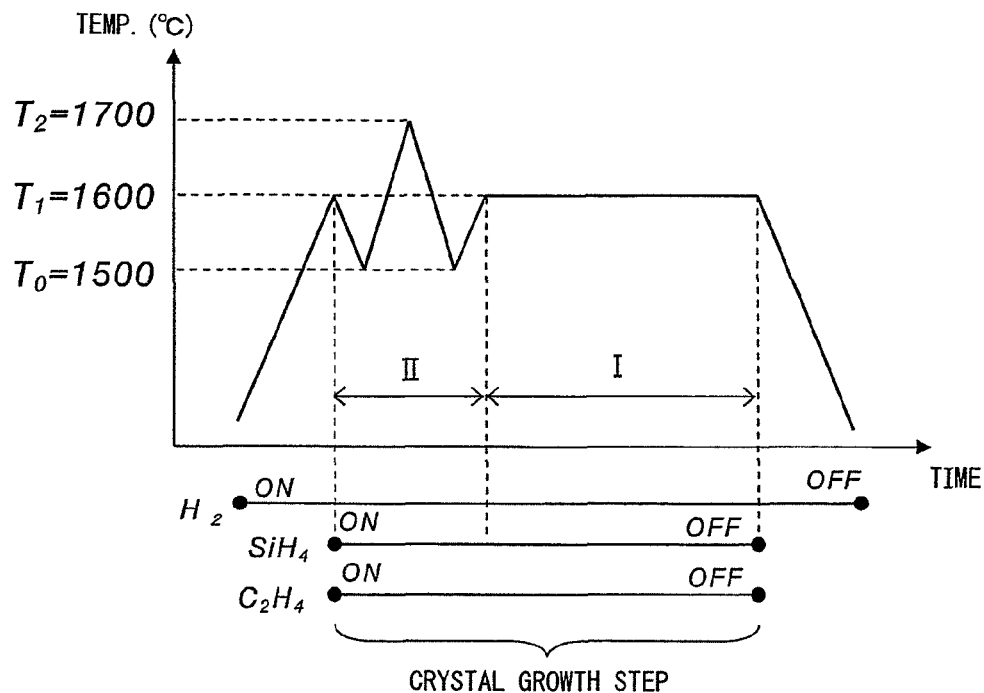
FIG. 3 illustrates the growth sequence to be used in Example 1 of the present invention.

The SiC substrate which had been prepared above was put in a growth furnace (normal temperature), the inside of the growth furnace was evacuated, and then the pressure was adjusted to $1.0 \times 10^4$ Pa, while introducing thereinto a hydrogen gas at 150 L/min. Thereafter, as shown in FIG. 3, the temperature in the growth furnace was raised to 1,600° C. ($T_1$) while keeping the pressure therein constant, and raw material gases of $SiH_4$ and $C_2H_4$ were flowed thereinto at a flow rate of 40 cm$^3$/min and 22 cm$^3$/min, respectively, so as to start epitaxial growth. In this Example 1, immediately after the start of the epitaxial growth, a temperature switching operation was performed in the following manner, with $SiH_4$ and $C_2H_4$ flowing while maintaining respective flow rates as stated above.

i) First, the decreasing of the temperature in the growth furnace was started simultaneously with the start of the epitaxial growth, and the temperature was decreased to 1,500° C. ($T_0$) with the elapse of time of 1 minute.

ii) Next, when the temperature in the furnace reached 1,500° C., the raising of the temperature in the furnace was immediately started, and the temperature was raised to 1,700° C. ($T_2$) with the elapse of time of 2 minutes [$T_0$-$T_2$ switching action].

iii) When the temperature in the furnace reached 1,700° C., the decreasing of the temperature in the furnace was immediately started, and the temperature was decreased to 1,500° C. ($T_0$) with the elapse of time of 2 minutes [$T_2$-$T_0$ switching action].

iv) Further, when temperature in the furnace reached 1,500° C., the raising of the temperature in the furnace was immediately started, and the temperature was raised to 1,600° C. ($T_1$) with the elapse of time of 1 minute.

Subsequently, while maintaining the flow rates of $SiH_4$ and $C_2H_4$, the epitaxial growth was further performed for 90 minutes by holding the temperature in the furnace at 1,600° C. Thereafter, the introduction of $SiH_4$ and $C_2H_4$ was stopped, and the temperature in the furnace was decreased with only a hydrogen gas flowing. After the temperature was decreased to normal temperature, the introduction of a hydrogen gas was stopped, the inside of the growth furnace was evacuated, and the inside of the growth furnace was returned to atmospheric pressure by introducing an inert gas, and then the thus obtained epitaxial silicon carbide single crystal substrate was taken out from the growth furnace.

In the epitaxial growth of a silicon carbide film according to this Example 1, a silicon carbide film having a thickness of 10 μm was formed in total of the crystal growth sub-step involving a temperature switching operation and the subsequent crystal growth main step, and the growth rate of the silicon carbide film in the entire crystal growth step was about 7 μm/hr. According to an estimate by calculation, the film thickness of the silicon carbide film which had been grown in the crystal growth sub-step was about 0.5 μm.

Figure 4:
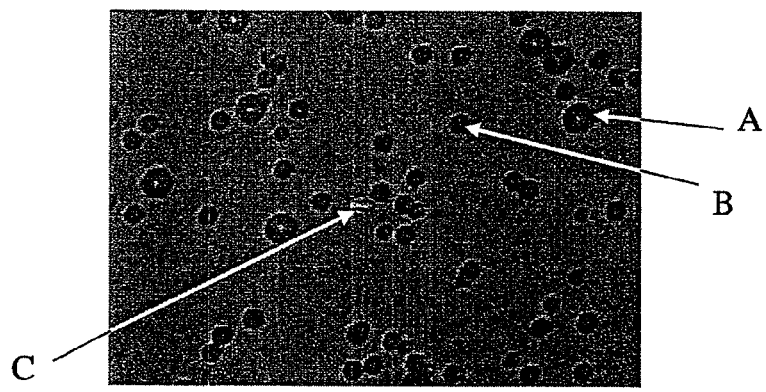
FIG. 4 is an optical micrograph showing an etch pit which has been produced after the KOH etching of the silicon carbide film obtained in Example 1.

With respect to the thus obtained epitaxial silicon carbide single crystal substrate, the grown silicon carbide film was etched with molten KOH. FIG. 4 shows an optical micrograph of the silicon carbide film surface, on which etch pits appears.

In the photograph of FIG. 4, the symbol "A" indicated by arrow denotes an etch pit attributed to screw dislocation, the symbol "B" denotes an etch pit attributed to edge dislocation, and the symbol "C" denotes an etch pit attributed to basal plane dislocation. The silicon carbide film of the thus obtained epitaxial silicon carbide single crystal substrate was evaluated for the etch pit in the wafer plane by such etching with molten KOH. As a result, the average basal plane dislocation density was 15 dislocations/cm$^2$, and the average edge dislocation density was from 5,000 to 10,000 dislocations/cm$^2$.

By use of the epitaxial film of the epitaxial silicon carbide single crystal substrate which had been obtained by the process of Example 1, a Schottky barrier diode (diameter: 2 mm) was formed. In this Schottky barrier diode, Ni was vapor-deposited on the back surface of the diode, and was then heat-treated to serve as an ohmic electrode. With respect to the Schottky electrode on the front surface, Ni was vapor-deposited.

Forward-direction characteristics were evaluated on 100 diodes in total. As a result, the linearity at the current rise was good in all diodes, and the "n" value indicative of the diode performance was 1.01 on average, and it was found that almost ideal characteristics were obtained.

Example 2

By use of a silicon carbide single crystal substrate which had been prepared in the same manner as in Example 1, the epitaxial growth was performed on the Si surface of this SiC substrate. The preparation steps before the starting of the epitaxial growth were the same as in Example 1.

In this Example 2, immediately after the starting of the epitaxial growth, temperature switching actions were performed in the order of i), ii) and iii) in the same manner as in Example 1 by maintaining the flow rates of $SiH_4$ and $C_2H_4$.

Further, in this Example 2, at the time at which the temperature in the furnace reached 1,500° C. after the action iii), the action ii) performed in Example 1 was again performed and the temperature in the furnace was raised to 1,700° C. ($T_2$), the action iii) was further performed, and the action iv) was finally performed. That is, in this Example 2, the temperature switching operation was performed so as to include two "$T_0$-$T_2$ switching actions" and two "$T_2$-$T_0$ switching actions".

Subsequently, while maintaining the flow rates of $SiH_4$ and $C_2H_4$, the epitaxial growth was further performed for 90 minutes by holding the temperature in the furnace at 1,600° C. and after the completion of the crystal growth step, the epitaxial silicon carbide single crystal substrate was taken out in the same manner as in Example 1. In the epitaxial growth of a silicon carbide film according to Example 2, a silicon carbide film having a thickness of 10.5 μm was formed in total of the crystal growth sub-step involving a temperature switching operation and the subsequent crystal growth main step. The growth rate of the silicon carbide film in the entire crystal growth step was about 7 μm/hr. According to an estimate by calculation, the film thickness of the silicon carbide film grown in the crystal growth sub-step was about 1 μm.

With respect to the thus obtained epitaxial silicon carbide single crystal substrate, the evaluation of the dislocation density by the etch pit was performed in the same manner as in Example 1. As a result, the average basal plane dislocation density was 12 dislocations/cm². In addition, by use of the epitaxial film of the thus obtained epitaxial silicon carbide single crystal substrate which had been obtained by the process of Example 2, a Schottky barrier diode was formed in the same manner as in Example 1, and the reverse-direction voltage resistance was evaluated on 100 diodes in total. As a result, the voltage resistance (median) of the diode was 300 V.

Example 3

A silicon carbide single crystal ingot for a 3-inch (76 mm) wafer was sliced so as to provide a wafer having a thickness of about 400 μm, and then was subjected to roughening and normal polishing with a diamond abrasive grain, to thereby prepare a silicon carbide single crystal substrate containing a 4H poly-type and having an off-angle of 2° in the [11-20] direction with respect to <0001> c-axis. This silicon carbide single crystal substrate was n-type, where the resistivity was about 0.02 Ω·cm.

An epitaxial silicon carbide single crystal substrate was obtained in the same manner as in Example 1, except for using the silicon carbide single crystal substrate which had been obtained in the above manner. In the epitaxial growth of a silicon carbide film according to this Example 3, a silicon carbide film having a thickness of 10 μm was formed in total of the crystal growth sub-step involving a temperature switching operation and the subsequent crystal growth main step, and the growth rate of the silicon carbide film in the entire crystal growth step was about 7 μm/hr. According to an estimate by calculation, the film thickness of the silicon carbide film grown in the crystal growth sub-step is about 0.5 μm.

With respect to the thus obtained epitaxial silicon carbide single crystal substrate, the evaluation of the dislocation density by the etch pit was performed in the same manner as in Example 1. As a result, the average basal plane dislocation density was 10 dislocations/cm².

Example 4

A silicon carbide single crystal ingot for a 3-inch (76 mm) wafer was sliced so as to provide a wafer having a thickness of about 400 μm, and then was subjected to roughening and normal polishing with a diamond abrasive grain, to thereby prepare a silicon carbide single crystal substrate containing a 4H poly-type and having an off-angle of 6° in the [11-20] direction with respect to <0001> c-axis. This silicon carbide single crystal substrate was n-type, where the resistivity was about 0.02 Ω·cm.

An epitaxial silicon carbide single crystal substrate was obtained in the same manner as in Example 1, except for using the silicon carbide single crystal substrate which had been obtained in the above manner. In the epitaxial growth of a silicon carbide film according to this Example 4, a silicon carbide film having a thickness of 10 μm was formed in total of the crystal growth sub-step involving a temperature switching operation and the subsequent crystal growth main step, and the growth rate of the silicon carbide film in the entire crystal growth step was about 7 μm/hr. According to an estimate by calculation, the film thickness of the silicon carbide film grown in the crystal growth sub-step was about 0.5 μm.

With respect to the thus obtained epitaxial silicon carbide single crystal substrate which had been obtained in the above manner, the evaluation of the dislocation density by the etch pit was performed in the same manner as in Example 1. As a result, the average basal plane dislocation density was 20 dislocations/cm².

Example 5

By use of a silicon carbide single crystal substrate which had been prepared in the same manner as in Example 1, the epitaxial growth was performed on the Si surface of this SiC substrate. Preparation steps before the starting of the epitaxial growth were the same as in Example 1. In addition, immediately after the starting of the epitaxial growth, a temperature switching operation was performed as follows by maintaining the flow rates of $SiH_4$ and $C_2H_4$.

i') First, raising of the temperature in the growth furnace was started simultaneously with the start of epitaxial growth, and the temperature was raised to 1,700° C. ($T_2$) with the elapse of time of 1 minute.

iii) When the temperature in the furnace reached 1,700° C., the decreasing of the temperature in the furnace was immediately started, and the temperature was decreased to 1,500° C. ($T_0$) with the elapse of time of 2 minutes [$T_2$-$T_0$ switching action].

ii) Next, when the temperature in the furnace reached 1,500° C., the raising of the temperature in the furnace was immediately started, and the temperature was raised to 1,700° C. ($T_2$) with the elapse of time of 2 minutes [$T_0$-$T_2$ switching action].

iv') Further, when the temperature in the furnace reached 1,700° C., the decreasing of the temperature in the furnace was immediately started, and the temperature was decreased to 1,600° C. ($T_1$) with the elapse of time of 1 minute.

Subsequently, while maintaining the flow rates of $SiH_4$ and $C_2H_4$, the epitaxial growth was further performed for 90 minutes by holding the temperature in the furnace at 1,600° C. After the completion of crystal growth step, the epitaxial silicon carbide single crystal substrate was taken out in the same manner as in Example 1.

In the epitaxial growth of a silicon carbide film according to this Example 5, a silicon carbide film having a thickness of 10 μm was formed in total of the crystal growth sub-step involving a temperature switching operation and the subsequent crystal growth main step, and the growth rate of the silicon carbide film in the entire crystal growth step was about 7 μm/hr. According to an estimate by calculation, the film thickness of the silicon carbide film grown in the crystal growth sub-step was about 0.5 μm.

With respect to the epitaxial silicon carbide single crystal substrate which had been obtained in the above manner, the evaluation of the dislocation density by the etch pit was performed in the same manner as in Example 1. As a result, the average basal plane dislocation density was 16 dislocations/cm$^2$.

Comparative Example 1

By use of a silicon carbide single crystal substrate which had been prepared in the same manner as in Example 1, the epitaxial growth was performed on the Si surface of this SiC substrate. Preparation steps before the starting of the epitaxial growth were the same as in Example 1.

After the epitaxial growth started, the epitaxial growth was performed for 90 minutes by maintaining the growth temperature of 1,600° C. without changing the temperature, and after the completion of crystal growth step, the epitaxial silicon carbide single crystal substrate was taken out in the same manner as in Example 1. In this Comparative Example 1, a silicon carbide film having a thickness of 10 μm was formed, and the growth rate of the silicon carbide film was about 7 μm/hr.

With respect to the thus obtained epitaxial silicon carbide single crystal substrate, the evaluation of the dislocation density by the etch pit was performed in the same manner as in Example 1. As a result, the average basal plane dislocation density was 95 dislocations/cm$^2$.

In addition, a Schottky barrier diode was formed in the same manner as in Example 1, and forward-direction characteristics were evaluated on 100 diodes in total. As a result, the "n" value indicative of the diode performance was 1.10 on average, and it was found that the results were poor as compared with those in Example 1. Further, the reverse voltage resistance was evaluated on 100 diode in total. As a result, the voltage resistance (median) of the diode was 280 V, and it was found that the results were poor as compared with those in Example 2.

Comparative Example 2

By use of a silicon carbide single crystal substrate which had been prepared in the same manner as in Example 1, the epitaxial growth was performed on the Si surface of this SiC substrate. Preparation steps before the starting of the epitaxial growth were the same as in Example 1. In addition, immediately after the starting of the epitaxial growth, only a temperature switching action i) was performed in the same manner as in Example 1 by maintaining the flow rates of SiH$_4$ and C$_2$H$_4$. Subsequently, the action iv) was performed. Further, the epitaxial growth was performed for 90 minutes by maintaining the growth temperature of 1,600° C. without changing the temperature, and after the completion of crystal growth step, the epitaxial silicon carbide single crystal substrate was taken out in the same manner as in Example 1. In this Comparative Example 1, a silicon carbide film having a thickness of 10 μm was formed, and the growth rate of the silicon carbide film was about 7 μm/hr.

With respect to the thus obtained epitaxial silicon carbide single crystal substrate, the evaluation of the dislocation density by the etch pit was performed in the same manner as in Example 1. As a result, the average basal plane dislocation density was 90 dislocations/cm$^2$. That is, in a case where the temperature is decreased only once, the effect of reducing the basal plane dislocation density was insufficient.

Examples 6 to 14 and Comparative Examples 3 and 4

Silicon carbide single crystal substrates which were different in the off-angle were prepared in the same manner as in Example 1, and the epitaxial growth was performed on the Si surface of each of these SiC substrates. Preparation steps before the starting of the epitaxial growth was the same as in Example 1, except for setting the preset temperature $T_1$ in the growth furnace as shown in Tables 1 to 3, and by a process including a temperature switching operation with preset temperatures $T_0$ and $T_2$ as shown in Tables 1 to 3, epitaxial silicon carbide single crystal substrates of Examples 6 to 14 and Comparative Examples 3 and 4 were obtained.

Herein, the switching actions i, i', ii, iii, iv and iv' as shown in Tables 1 to 3 are based on the contents as described hereinabove, but preset temperatures $T_0$, $T_1$ and $T_2$ and the time spent for switching were set as shown in Tables 1 to 3. In addition, for example, in Example 6, it is meant that crystal growth was performed by maintaining the preset temperature $T_1$ in the growth furnace for 20 minutes after the starting of the epitaxial growth, and thereafter, through a crystal growth sub-step involving a temperature switching operation, crystal growth was again performed for 70 minutes by maintaining the preset temperature $T_1$ in the growth furnace. With respect to each of the thus obtained epitaxial silicon carbide single crystal substrates, the evaluation of the dislocation density by the etch pit was performed in the same manner as in Example 1. The results are shown in Tables 1 to 3.

TABLE 1

| | Substrate Off-Angle | Temperature Condition: ° C. | Temperature Switching Operation Switching Action | Crystal Growth Step Time Table: min | Film Thickness (Portion Grown in Sub-Step): μm | Basal Plane Dislocation Density: dislocations/cm$^2$ |
|---|---|---|---|---|---|---|
| Ex. 1 | 4° | $T_0$ = 1500, $T_1$ = 1600, $T_2$ = 1700 | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | 0 ≤ t ≤ 6: TS<br>6 < t ≤ 96: $T_1$ = 1600 | 10 (0.5) | 15 |
| Ex. 2 | 4° | $T_0$ = 1500, $T_1$ = 1600, $T_2$ = 1700 | i ($T_1 \Rightarrow T_0$: 1 min)→ii ($T_0 \Rightarrow T_2$: 2 min)→iii ($T_2 \Rightarrow T_0$: 2 min)→ii ($T_0 \Rightarrow T_2$: 2 min)→iii ($T_2 \Rightarrow T_0$: 2 min)→iv ($T_0 \Rightarrow T_1$: 1 min) | 0 ≤ t ≤ 10: TS<br>10 < t ≤ 100: $T_1$ = 1600 | 10.5 (1.0) | 12 |
| Ex. 3 | 2° | $T_0$ = 1500, $T_1$ = 1600, $T_2$ = 1700 | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | 0 ≤ t ≤ 6: TS<br>6 < t ≤ 96: $T_1$ = 1600 | 10 (0.5) | 10 |

TABLE 1-continued

| | Substrate Off-Angle | Temperature Switching Operation | | Crystal Growth Step Time Table: min | Film Thickness (Portion Grown in Sub-Step): μm | Basal Plane Dislocation Density: dislocations/cm$^2$ |
|---|---|---|---|---|---|---|
| | | Temperature Condition: ° C. | Switching Action | | | |
| Ex. 4 | 6° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 6$: TS $6 < t \leq 96$: $T_1 = 1600$ | 10 (0.5) | 20 |
| Ex. 5 | 4° | $T_0 = 1500$, $T_1 = 1600$, $T_2 = 1700$ | i' ($T_1 \Rightarrow T_2$: 1 min)→iii ($T_2 \Rightarrow T_0$: 2 min)→ii ($T_0 \Rightarrow T_2$: 2 min)→iv' ($T_2 \Rightarrow T_1$: 1 min) | $0 \leq t \leq 6$: TS $6 < t \leq 96$: $T_1 = 1600$ | 10 (0.5) | 16 |
| Ex. 6 | 4° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 20$: $T_1 = 1600$ $20 < t \leq 26$: TS $26 < t \leq 96$: $T_1 = 1600$ | 10 (0.5) | 18 |
| Ex. 7 | 4° | $T_0 = 1500$, $T_1 = 1600$, $T_2 = 1700$ | i' ($T_1 \Rightarrow T_2$: 1 min)→iii ($T_2 \Rightarrow T_0$: 2 min)→ii ($T_0 \Rightarrow T_2$: 2 min)→iv' ($T_2 \Rightarrow T_1$: 1 min) | $0 \leq t \leq 20$: $T_1 = 1600$ $20 < t \leq 26$: TS $26 < t \leq 96$: $T_1 = 1600$ | 10 (0.5) | 17 |
| Ex. 8 | 2° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 20$: $T_1 = 1600$ $20 < t \leq 26$: TS $26 < t \leq 96$: $T_1 = 1600$ | 10 (0.5) | 11 |

TS: temperature switching

TABLE 2

| | Substrate Off-Angle | Temperature Switching Operation | | Crystal Growth Step Time Table: min | Film Thickness (Portion Grown in Sub-Step): μm | Basal Plane Dislocation Density: dislocations/cm$^2$ |
|---|---|---|---|---|---|---|
| | | Temperature Condition: ° C. | Switching Action | | | |
| Ex. 9 | 6° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 20$: $T_1 = 1600$ $20 < t \leq 26$: TS $26 < t \leq 96$: $T_1 = 1600$ | 10 (0.5) | 20 |
| Ex. 10 | 2° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 20$: $T_1 = 1600$ $20 < t \leq 30$: TS $30 < t \leq 100$: $T_1 = 1600$ | 10.5 (1.0) | 8 |
| Ex. 11 | 6° | $T_0 = 1500$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 20$: $T_1 = 1600$ $20 < t \leq 30$: TS $30 < t \leq 100$: $T_1 = 1600$ | 10.5 (1.0) | 16 |
| Ex. 12 | 4° | $T_0 = 1500$, $T_1 = 1580$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 6$: TS $6 < t \leq 96$: $T_1 = 1580$ | 10 (0.5) | 16 |
| Ex. 13 | 4° | $T_0 = 1520$, $T_1 = 1600$, $T_2 = 1700$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 6$: TS $6 < t \leq 96$: $T_1 = 1600$ | 10 (0.5) | 17 |
| Ex. 14 | 4° | $T_0 = 1500$, $T_1 = 1600$, $T_2 = 1680$ | i ($T_1 \Rightarrow T_0$: 1 min)→ii ($T_0 \Rightarrow T_2$: 2 min)→iii ($T_2 \Rightarrow T_0$: 2 min)→iv ($T_0 \Rightarrow T_1$: 1 min) | $0 \leq t \leq 6$: TS $6 < t \leq 96$: $T_1 = 1600$ | 10 (0.5) | 16 |

TS: temperature switching

TABLE 3

| | Substrate Off-Angle | Temperature Switching Operation | | Crystal Growth Step Time Table: min | Film Thickness (Portion Grown in Sub- Step): μm | Basal Plane Dislocation Density: dislocations/cm$^2$ |
|---|---|---|---|---|---|---|
| | | Temperature Condition: ° C. | Switching Action | | | |
| Comp. Ex. 1 | 4° | $T_1 = 1600$ | no switching action | $0 \leq t \leq 90$: $T_1 = 1600$ | 10 (—) | 95 |
| Comp. Ex. 2 | 4° | $T_0 = 1500$, $T_1 = 1600$ | i ($T_1 \Rightarrow T_0$: 1 min) | $0 \leq t \leq 1$: TS $1 < t \leq 91$: $T_1 = 1600$ | 10 (0.1) | 90 |
| Comp. Ex. 3 | 2° | $T_1 = 1600$ | no switching action | $0 \leq t \leq 90$: $T_1 = 1600$ | 10 (—) | 60 |
| Comp. Ex. 4 | 6° | $T_1 = 1600$ | no switching action | $0 \leq t \leq 90$: $T_1 = 1600$ | 10 (—) | 120 |

TS: temperature switching

DESCRIPTION OF REFERENCE NUMERALS

1: Basal plane dislocation contained in SiC substrate
2: Basal plane dislocation to be carried over into epitaxial film
3: Edge dislocation

The invention claimed is:

1. An epitaxial silicon carbide single crystal substrate, which is an epitaxial silicon carbide single crystal substrate which has been obtained by a process for producing an epitaxial silicon carbide single crystal substrate, comprising forming a silicon carbide film through epitaxial growth on a silicon carbide single crystal substrate having an off-angle of 2° or more and 6° or less by a chemical vapor deposition process,
   wherein a crystal growth step of epitaxially growing the silicon carbide film on the substrate includes a crystal growth sub-step involving a temperature switching operation of changing a growth temperature up or down between a lower preset temperature $T_0$ and a higher preset temperature $T_2$ with respect to a growth temperature $T_1$ in a crystal growth main step occupying the majority of an epitaxial growth time,
   wherein the basal plane dislocation density of the silicon carbide film is 20 dislocations/cm$^2$ or less,
   wherein a film thickness of the silicon carbide film grown in the crystal growth sub-step is 0.2 μm or more and 1.0 μm or less,
   wherein the basal plane dislocation carried over from the silicon carbide single crystal substrate is converted into an edge dislocation in the silicon carbide film grown in the crystal growth sub-step, and
   wherein the basal plane dislocation density of the silicon carbide film is no more than 0.3% of an edge dislocation density of the silicon carbide film.

2. An epitaxial silicon carbide single crystal substrate, which is an epitaxial silicon carbide single crystal substrate which has been obtained by a process for producing an epitaxial silicon carbide single crystal substrate, comprising forming a silicon carbide film through epitaxial growth on a silicon carbide single crystal substrate having an off-angle of 2° or more and 6° or less by a chemical vapor deposition process,
   wherein a crystal growth step of epitaxially growing the silicon carbide film on the substrate includes a crystal growth sub-step involving a temperature switching operation of changing a growth temperature up or down between a lower preset temperature $T_0$ and a higher preset temperature $T_2$ with respect to a growth temperature $T_1$ in a crystal growth main step occupying the majority of an epitaxial growth time,
   wherein the crystal growth sub-step is included in a first half side of the crystal growth step,
   wherein the basal plane dislocation density of the silicon carbide film is 20 dislocations/cm$^2$ or less,
   wherein a film thickness of the silicon carbide film grown in the crystal growth sub-step is 0.2 μm or more and 1.0 μm or less,
   wherein the basal plane dislocation carried over from the silicon carbide single crystal substrate is converted into an edge dislocation in the silicon carbide film grown in the crystal growth sub-step, and
   wherein the basal plane dislocation density of the silicon carbide film is no more than 0.3% of an edge dislocation density of the silicon carbide film.

* * * * *